(12) United States Patent
Ravasio et al.

(10) Patent No.: US 9,773,844 B2
(45) Date of Patent: Sep. 26, 2017

(54) MEMORY CELL ARRAY STRUCTURES AND METHODS OF FORMING THE SAME

(71) Applicant: Micron Technology, Inc., Boise, ID (US)

(72) Inventors: Marcello Ravasio, Olgiate Molgora (IT); Samuele Sciarrillo, Lomagna (IT); Roberto Somaschini, Vimercate (IT); Gabriel L. Donadio, Alghero (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/970,602

(22) Filed: Dec. 16, 2015

(65) Prior Publication Data

US 2016/0104748 A1 Apr. 14, 2016

Related U.S. Application Data

(63) Continuation of application No. 13/949,315, filed on Jul. 24, 2013, now Pat. No. 9,246,100.

(51) Int. Cl.
*H01L 27/24* (2006.01)
*G11C 13/00* (2006.01)
*H01L 45/00* (2006.01)
*G11C 5/06* (2006.01)

(52) U.S. Cl.
CPC ......... *H01L 27/2481* (2013.01); *G11C 5/063* (2013.01); *H01L 27/2409* (2013.01); *H01L 45/06* (2013.01); *H01L 45/1233* (2013.01); *H01L 45/141* (2013.01); *H01L 45/1608* (2013.01); *H01L 45/1666* (2013.01); *H01L 45/1675* (2013.01); *G11C 13/0002* (2013.01); *G11C 2213/71* (2013.01)

(58) Field of Classification Search
CPC ............ H01L 27/2481; H01L 27/2409; H01L 45/1666; H01L 45/141; H01L 45/1675; H01L 45/06; H01L 45/1233; H01L 45/1608; G11C 5/063; G11C 13/0002; G11C 2213/71
USPC ............ 365/63, 130, 158, 173; 257/278, 74
See application file for complete search history.

(56) References Cited

U.S. PATENT DOCUMENTS

| | | | |
|---|---|---|---|
| 5,946,230 A * | 8/1999 | Shimizu | H01L 27/105 257/314 |
| 6,466,475 B1 | 10/2002 | Nickel | |
| 6,573,586 B2 | 6/2003 | Sakata et al. | |
| 7,064,380 B2 * | 6/2006 | Fukumura | H01L 27/115 257/315 |
| 7,352,035 B1 * | 4/2008 | Song | H01L 27/115 257/392 |
| 7,515,502 B1 | 4/2009 | Ahsan et al. | |
| 7,816,717 B2 | 10/2010 | Ozaki | |
| 7,863,668 B2 * | 1/2011 | Takahashi | H01L 27/115 257/314 |

(Continued)

*Primary Examiner* — Vu Le
*Assistant Examiner* — Sung Cho
(74) *Attorney, Agent, or Firm* — Brooks, Cameron & Huebsch, PLLC

(57) ABSTRACT

The present disclosure includes memory cell array structures and methods of forming the same. One such array includes a stack structure comprising a memory cell between a first conductive material and a second conductive material. The memory cell can include a select element and a memory element. The array can also include an electrically inactive stack structure located at an edge of the stack structure.

20 Claims, 18 Drawing Sheets

(56) References Cited

U.S. PATENT DOCUMENTS

| | | | |
|---|---|---|---|
| 8,258,040 B2* | 9/2012 | Ito | H01L 27/0207 257/E21.396 |
| 8,351,236 B2 | 1/2013 | Yan et al. | |
| 8,437,170 B2* | 5/2013 | Fukano | G11O 5/025 365/148 |
| 8,466,506 B2* | 6/2013 | Takekida | H01L 27/11521 257/315 |
| 8,547,721 B2 | 10/2013 | Ahn et al. | |
| 8,559,209 B2 | 10/2013 | Siau et al. | |
| 8,574,929 B1 | 11/2013 | Or-Bach et al. | |
| 8,581,349 B1 | 11/2013 | Sekar et al. | |
| 8,837,200 B2* | 9/2014 | Tsuji | G11C 11/1673 365/148 |
| 9,012,969 B2* | 4/2015 | Kamigaichi | H01L 27/11519 257/315 |
| 9,029,829 B1 | 5/2015 | Echeverry et al. | |
| 2002/0022311 A1* | 2/2002 | Takeuchi | H01L 23/528 438/200 |
| 2007/0170547 A1* | 7/2007 | Chang | H01L 21/76838 257/532 |
| 2009/0197385 A1 | 8/2009 | Seo | |
| 2009/0283901 A1 | 11/2009 | Ohmi | |
| 2012/0156866 A1 | 6/2012 | Ahn | |
| 2013/0021837 A1 | 1/2013 | Scheuerlein | |
| 2013/0249113 A1 | 9/2013 | Baba | |
| 2013/0250646 A1 | 9/2013 | Iida | |
| 2013/0294146 A1 | 11/2013 | Kim et al. | |

\* cited by examiner

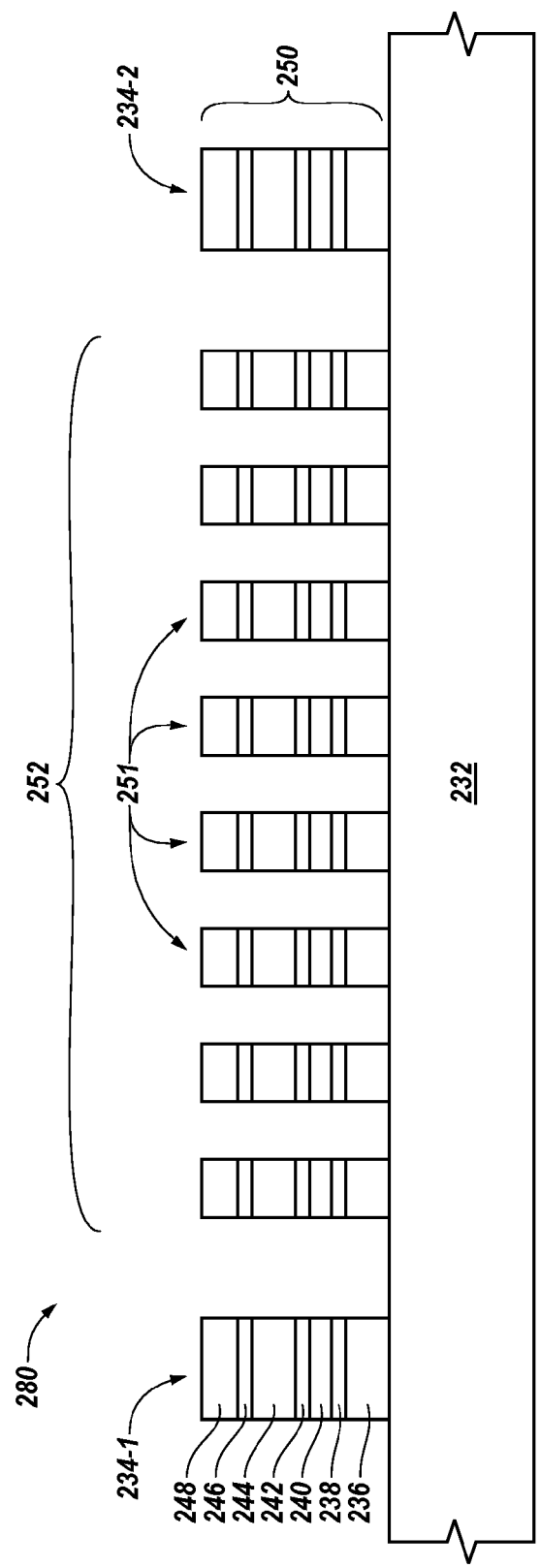

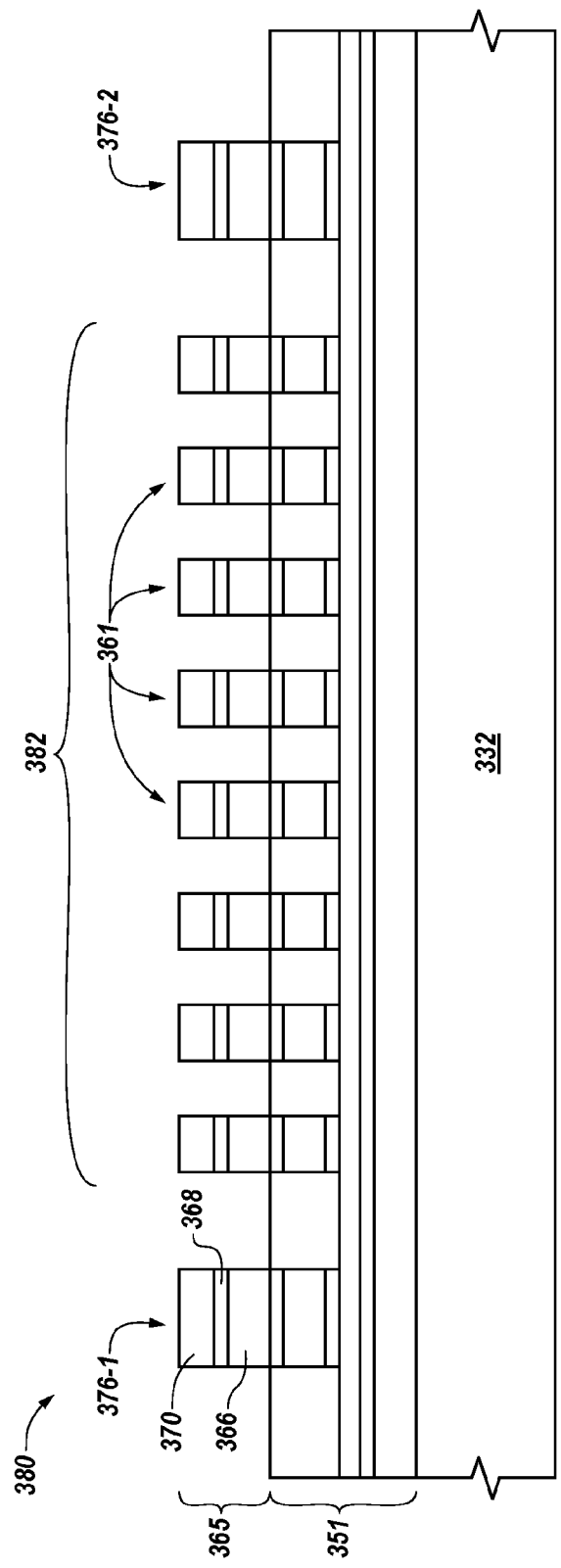

MEMORY CELL ARRAY STRUCTURES AND METHODS OF FORMING THE SAME

PRIORITY INFORMATION

This application is a Continuation of U.S. application Ser. No. 13/949,315 filed Jul. 24, 2013, the specification of which is incorporated herein by reference.

TECHNICAL FIELD

The present disclosure relates generally to semiconductor memory devices and methods, and more particularly, memory cell array structures and methods for forming the same.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), flash memory, phase change random access memory (PCRAM), spin torque transfer random access memory (STTRAM), resistive random access memory (RRAM), magnetoresistive random access memory (MRAM; also referred to as magnetic random access memory), conductive-bridging random access memory (CBRAM), among others.

Some types of memory devices can be non-volatile memory and can be used for a wide range of electronic applications in need of high memory densities, high reliability, and low power consumption. Non-volatile memory may be used in a personal computer, a portable memory stick, a solid state drive (SSD), a personal digital assistant (PDA), a digital camera, a cellular telephone, a smartphone, a tablet, a portable music player, e.g., MP3 player, a movie player, and other electronic devices, among others. Program code and system data, such as a basic input/output system (BIOS), are typically stored in non-volatile memory devices.

Many memory devices, such as RRAM, PCRAM, MRAM, STTRAM and CBRAM, for example, can include arrays of memory cells organized in a two-terminal cross-point architecture, for instance. Arrays of memory cells in a two-terminal cross-point architecture can include electrodes that have planar surfaces between the memory cell material. For filamentary-type memory devices, e.g., RRAM and/or CBRAM, the location of the active region of the memory cell between planar surfaces of the electrodes can be variable because the planar surfaces of the electrodes provide a substantially uniform electric field across the memory cell material.

BRIEF DESCRIPTION OF THE DRAWINGS

FIG. 2A illustrates a cross-sectional view of a portion of an array of memory cells in accordance with a number of embodiments of the present disclosure.

FIGS. 3A-3B illustrate cross-sectional views of a portion of an array of memory cells in accordance with a number of embodiments of the present disclosure.

DETAILED DESCRIPTION

Figure 1A:
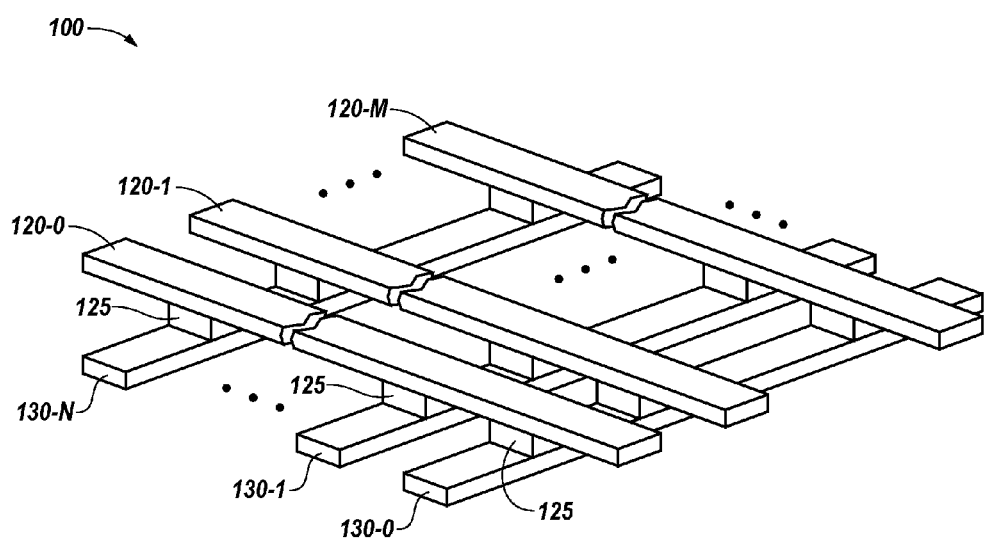
FIGS. 1A-1B are block diagrams illustrating portions of an array of memory cells.

The present disclosure includes memory cell array structures and method of forming the same. In a number of embodiments one such array includes a stack structure comprising a memory cell between a first conductive material and a second conductive material. The memory cell can include a select element and a memory element. The array can also include an electrically inactive stack structure, e.g., isolated dummy stack structure, located at an edge of the stack structure.

In a number of embodiments, forming an array of memory cells includes patterning an active memory cell stack structure and a dummy material stack structure to expose the dummy material stack structure. Forming an array of memory cells also includes removing a portion of the dummy material stack structure, forming a dielectric material over the active memory cell stack structure, and forming the dielectric material over the dummy material stack structure to electrically inactivate, e.g., isolate, the dummy material stack structure.

As mentioned, embodiments of the present disclosure can provide memory cell arrays having electrically inactive dummy material portions, e.g., dummy memory cell stack structures. Electrically inactive dummy material portions can reduce edge array effects, e.g., isometric-dense (iso-dense) loading effects, which can occur during memory cell array patterning, e.g., dry etch patterning, and can produce anomalous morphologies and electrical failures. In cross-point memory arrays, using inactive dummy material portions may be challenging to implement, since every cell, defined and connected to array circuitry by two self-aligned etch processes may be electrically active, e.g. connected to the array. That is, adding external dummy material portions may produce active material portions, which can reintroduce the iso-loading effect. Cross-point memory arrays in accordance with the present disclosure can be formed and electrically inactive dummy material portions can be formed, reducing undesired edge array effects. As such, embodiments can provide improved memory cells and/or memory cell arrays as compared to other approaches, among other benefits.

As used herein, "a number of" something can refer to one or more such things. For example, a number of memory devices can refer to one or more memory devices. Additionally, the designators "N" and "M" as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits.

FIG. 1A is a block diagram illustrating a portion of an array 100 of memory cells. In the example illustrated in FIG. 1A, the array 100 is a cross-point array including a first number of conductive lines 130-0, 130-1, . . . , 130-N, e.g., access lines, which may be referred to herein as word lines, and a second number of conductive lines 120-0, 120-1, . . . , 120-M, e.g., digit lines, which may be referred to herein as bit lines. As illustrated, the word lines 130-0, 130-1, . . . , 130-N can be substantially parallel to each other and can be substantially orthogonal to the bit lines 120-0, 120-1, . . . , 120-M, which can be substantially parallel to each other; however, embodiments are not so limited. The conductive lines can include conductive material, e.g., a metal material. Examples of the conductive material include, but are not limited to, tungsten, copper, titanium, aluminum, and/or combinations thereof, among other conductive materials.

The memory cells 125 of array 100 can be memory cells such as those described in connection with the memory cell arrays of FIGS. 2A-2K and FIGS. 3A-3E. In this example, a memory cell 125 is located at each of the intersections of the word lines 130-0, 130-1, . . . , 130-N and bit lines 120-0, 120-1, . . . , 120-M and the memory cells 125 can function in a two-terminal architecture, e.g., with a particular word line 130-0, 130-1, . . . , 130-N and bit line 120-0, 120-1, . . . , 120-M serving as the electrodes for the memory cells 125.

The memory cells 125 can be resistance variable memory cells, e.g., RRAM cells, CBRAM cells, PCRAM cells, and/or STT-RAM cells, among other types of memory cells. Memory cells can include, for example, a memory element, e.g., memory material, and a select element, e.g., a select device, an access device. The select element can be a diode or a non-ohmic device (NOD), among others. The select element can include, in some examples, select material, a first electrode material, and a second electrode material.

The memory element of memory cell 125 can include a memory portion of the memory cell 125, e.g., the portion programmable to different data states. For instance, in resistance variable memory cells, a memory element can include the portion of the memory cell having a resistance that is programmable to particular levels corresponding to particular data states responsive to applied programming voltage and/or current pulses, for instance.

A memory element can include, in some instances, memory material, a first electrode material, and a second electrode material. The memory element can include a number of memory materials, which collectively comprise a variable resistance storage element material portion of a memory element. For instance, the materials may include at least one of a metal ion source layer, an oxygen gettering, e.g., source, layer, and an active switching layer, such as a solid state electrolyte, a chalcogenide, a transition metal oxide material, or a mixed valence oxide with two or more metals, e.g., transition metals, alkaline earth metals, and/or rare earth metals. Embodiments are not limited to a particular resistance variable material or materials associated with the memory elements of the memory cells 125. For instance, the resistance variable material can be a chalcogenide formed of various doped or undoped materials. Other examples of resistance variable materials that can be used to form storage elements include binary metal oxide materials, colossal magnetoresistive materials, and/or various polymer based resistance variable materials, among others.

In operation, the memory cells 125 of array 100 can be programmed by applying a voltage, e.g., a write voltage, across the memory cells 125 via selected word lines 130-0, 130-1, . . . , 130-N and bit lines 120-0, 120-1, . . . , 120-M. The width and/or magnitude of the voltage pulses across the memory cells 125 can be adjusted, e.g., varied, in order to program the memory cells 125 to particular data states, e.g., by adjusting a resistance level of the storage element.

A sensing, e.g., read, operation can be used to determine the data state of a memory cell 125 by sensing current, for example, on a bit line 120-0, 120-1, . . . , 120-M corresponding to the respective memory cell responsive to a particular voltage applied to the selected word line 130-0, 130-1, . . . , 130-N to which the respective cell is coupled. Sensing operations can also include biasing unselected word lines and bit lines at particular voltages in order to sense the data state of a selected cell.

Figure 1B:
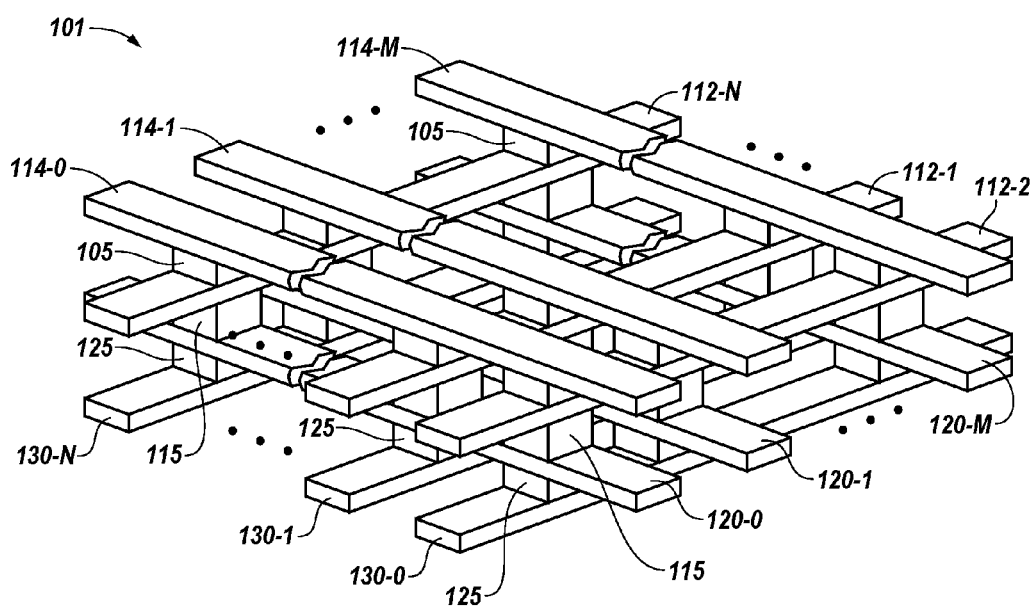

FIG. 1B is a block diagram illustrating a portion of an array 101 of memory cells. In the example illustrated in FIG. 1B, the array 101 is configured in a cross-point memory array architecture, e.g., a three-dimensional (3D) cross-point memory array architecture. The multi-deck cross-point memory array 101 comprises a number of successive memory cells, e.g., 105, 125 disposed between alternating, e.g., interleaved, decks of word lines, eg., 130-0, 130-1, . . . , 130-N and 112-0, 112-1, . . . , 112-N extending in a first direction and bit lines, e.g., 120-0, 120-1, . . . , 120-M and 114-0, 114-1, . . . , 114-M extending in a second direction.

The number of decks can be expanded in number or can be reduced in number, for example. Each of the memory cells 105, 125 can be configured between word lines, eg., 130-0, 130-1, . . . , 130-N and 112-0, 112-1, . . . , 112-N and bit lines, e.g., 120-0, 120-1, . . . , 120-M and 114-0, 114-1, . . . , 114-M, such that a single memory cell 105, 125 is directly electrically coupled with and is electrically in series with its respective bit line and word line. For example, array 101 can include a three-dimensional matrix of individually-addressable, e.g., randomly accessible, memory cells that can be accessed for data operations, e.g., sense and write, at a granularity as small as a single storage element or multiple storage elements. In a number of embodiments, memory array 101 can include more or less bit lines, word lines, and/or memory cells than shown in the examples in FIGS. 1A and 1B.

Memory cells in accordance with the present disclosure can be formed using various processing techniques such as atomic material, e.g., layer, deposition (ALD), physical vapor deposition (PVD), chemical vapor deposition (CVD), supercritical fluid deposition (SFD), patterning, etching, filling, chemical mechanical planarization (CMP), combinations thereof, and/or other suitable processes.

FIGS. 2A-2K illustrate cross-sectional views and/or block diagrams of a portion of an array of memory cells in accordance with a number of embodiments of the present disclosure. The portion of the array of memory cells in FIGS. 2A-2K can be a portion of an array such as array 100 illustrated in FIG. 1A and/or array 101 illustrated in FIG. 1B.

Figure 2B:
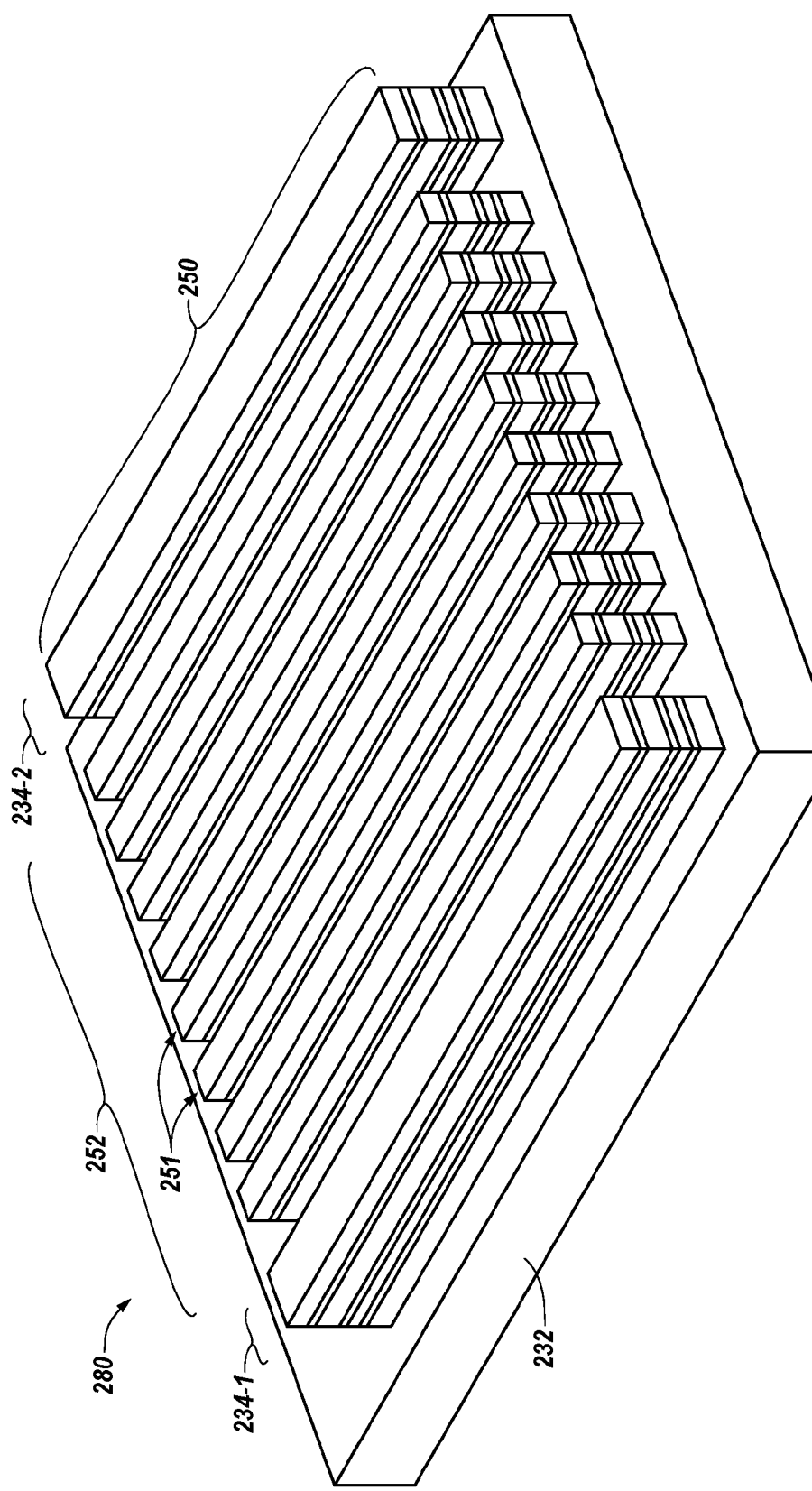
FIG. 2B is a block diagram illustrating a portion of an array of memory cells in accordance with a number of embodiments of the present disclosure.

In the example illustrated in FIG. 2A, a portion 250 of an array 280 of memory cells has been formed and etched. For instance, the portion 250 of memory cell array 280, e.g., a cross-point array, shown in FIGS. 2A-2K, can be created through dry etch patterning. Materials corresponding to respective conductive lines and components of the array and/or memory cell can be deposited and etched to form the various features. The dry etch patterning can form the various conductive lines and material portions, e.g., stack structures 251. Stack structures 251 can make up an active array portion 252 of array portion 250, for example.

Portion 250 can include a number of active material portions 251, e.g., active stack structures, and a number of dummy material portions 234-1 and 234-2, e.g., dummy stack structures. Two dummy material portions are illustrated in FIGS. 2A-2K, however more or fewer dummy material portions may be formed in a number of embodiments. In a number of embodiments, dummy material portions 234-1 and 234-2 comprise more than one dummy line. Dummy material portions 234-1 and 234-2 can be a different dimension, e.g., wider than a stack structure 251 within active array portion 252, and a space between, e.g., on either side of, active material portions 251 and dummy material portions 234-1 and 234-2 can comprise a threshold distance, for example. Dummy material portions 234-1 and 234-2 can be formed concurrently, in-situ, and/or according to the same process as the active material portions 251, and can be located on different edges, e.g., outer edge of an array 252 of active material structures 251 being formed, for example.

Active material portions 251, e.g., within active array portion 252, can include electrically active stack structures, e.g., electrically active memory cell stack structures. Active material portions 251 can be capable of coupling to another portion of a memory array, e.g., be electrically connected to the array. In a number of embodiments, a distance between the active stack structure and the electrically inactive dummy stack structure can be different, e.g., more or less, than a distance between two active stack structures, e.g., two different, adjacent active stack structures.

Dummy material portions, e.g., portions 234-1 and 234-2, can include, for instance material formed to a lower tolerance and formed external, e.g., on an outer edge, to the active array portion 252. For example, in patterning a memory cell array, outer memory cell stack structures can be deformed or marginalities can be generated, caused by an iso-dense loading effect. Dummy material portions, if electrically inactive, e.g., isolated, as compared to the rest of the array, can be utilized to reduce undesired edge array effects. In a number of embodiments of the present disclosure, dummy material portions can be inactive, e.g., be non-active, non-electrically connected portions used to reduce undesired edge array effects. In a number of embodiments, dummy material portions can be electrically inactive in cross-point memory arrays and/or three-dimensional cross-point memory arrays. In a number of embodiments, electrically inactive can include being in electrical contact with at least one of a first and second conductive material, e.g., a word line and a bit line. In various embodiments an electrically inactive stack can comprise a stack structure connected to only one of the first and second conductive materials. In a number of embodiments, electrically inactive can include electrically isolated, including from at least one of a first and second conductive material.

In a number of embodiments, each of the active stack structures 251 and the dummy stack structures 234-1 and 234-2 can include a conductive line, e.g., word line, material 236 formed over a substrate material 232. The substrate material 232 can be a dielectric material, for example, silicon oxide, among other substrate materials. Additionally or alternatively, the substrate material 232 can be an insulator material or a construction on a silicon wafer or the like, for example. Conductive line material 236 can be a conductive material, such as tungsten, among other conductive materials. An electrode material 238 can be formed over conductive line material 236, and the electrode material 238 can be a conductive material, such as carbon and/or tungsten, among other conductive materials. The electrode material 238 can be a bottom electrode, e.g., a conductive line, for example, an access line such as word lines 130-0 to 130-N and 112-0 to 112-N, or a data line such as bit lines 120-0 to 120-M and 114-0 to 114-M shown in FIGS. 1A and 1B.

In a number of embodiments, a select element 240 can be formed over electrode material 238. Select element 240 can comprise a select device material. Select element 240 can comprise a chalcogenide, e.g., a Ge—Sb—Te material such as $Ge_2Sb_2Te_5$, $Ge_1Sb_2Te_4$, $Ge_1Sb_4Te_7$, etc., among other resistance variable materials. The hyphenated chemical composition notation, as used herein, indicates the elements included in a particular mixture or compound, and is intended to represent all stoichiometries involving the indicated elements. Other resistance variable materials, which the select element 240 can comprise include Ge—Te, In—Se, Sb—Te, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt.

In a number of embodiments, electrode material 242 can be formed over select element 240 to form a stack structure. The electrode material 242 can be a conductive material, such as carbon and/or tungsten, for example. The electrode material 242 can be a middle electrode, e.g., electrically insulated from other memory cells for each individual memory cell.

The stack structure comprising electrode material 238, select element 240, and electrode material 242 can include metal-semiconductor-metal (MSM), metal-insulator-metal (MIM), and/or conductor-semiconductor-conductor (CSC) configurations, among others. For example, electrode material 238 can be a metal material, select element 240 can be a semiconductor material, and electrode material 242 can be a metal material. In some embodiments, select element 240 may comprise a stack structure of multiple semiconductor and or insulator materials, such that the entire stack structure has a configuration of one of metal-insulator-insulator-metal (MIIM), metal-semiconductor-semiconductor-metal (MSSM), metal-insulator-semiconductor-metal (MISM), metal-semiconductor-insulator-metal (MSIM), metal-insulator-semiconductor-insulator-metal (MISIM), metal-semiconductor-insulator-semiconductor-metal (MSISM), metal-insulator-insulator-insulator-metal (MIIIM), and metal-semiconductor-semiconductor-semiconductor-metal (MSSSM).

In a number of embodiments, memory element 244, e.g., memory material, is formed over electrode material 242. Memory element 244 can comprise, for example, PCRAM, STTRAM, RRAM, MRAM, PCM, CBRAM, and oxygen vacancy-based materials, among others. For example, memory element 244 can include a number of resistance variable materials such as a transition metal oxide material or a perovskite including two or more metals, e.g., transition metals, alkaline earth metals, and/or rare earth metals. Memory element 244 can include, for instance, a number of resistance variable materials such as a solid state electrolyte comprised of a transition metal oxide material or a phase change material, e.g., a chalcogenide material. Embodiments are not limited to a particular resistance variable material. In a number of embodiments, memory element 244 can comprise material that forms a storage material.

Electrode material 246 can be formed over memory element 244 in a number of embodiments. For instance, electrode material 246 and memory element 244 can form a stack structure or a portion of a stack structure, e.g., a memory element/memory cell stack structure. Electrode material 244 can be, for example, a top electrode and can comprise copper material, among other materials. A protective hardmask material 248 can be formed, e.g., via CVD, over electrode material 246. Hardmask material 248 can comprise, for example, a nitride material such as silicon nitride, among other hardmask materials. In a number of embodiments, hardmask material 248 can be used in a subsequent removal, e.g., dry etch, process.

FIG. 2B illustrates block diagram of a schematic view of the portion 250 of array 280 illustrated in FIG. 2A in accordance with a number of embodiments of the present disclosure. Array 280 can include a three-dimensional cross-point array, for example. Similar to FIG. 2A, portion 250 can comprise substrate 232, dummy material portions 234-1 and 234-2 and active material portions 251 within active array portion 252.

Figure 2C:
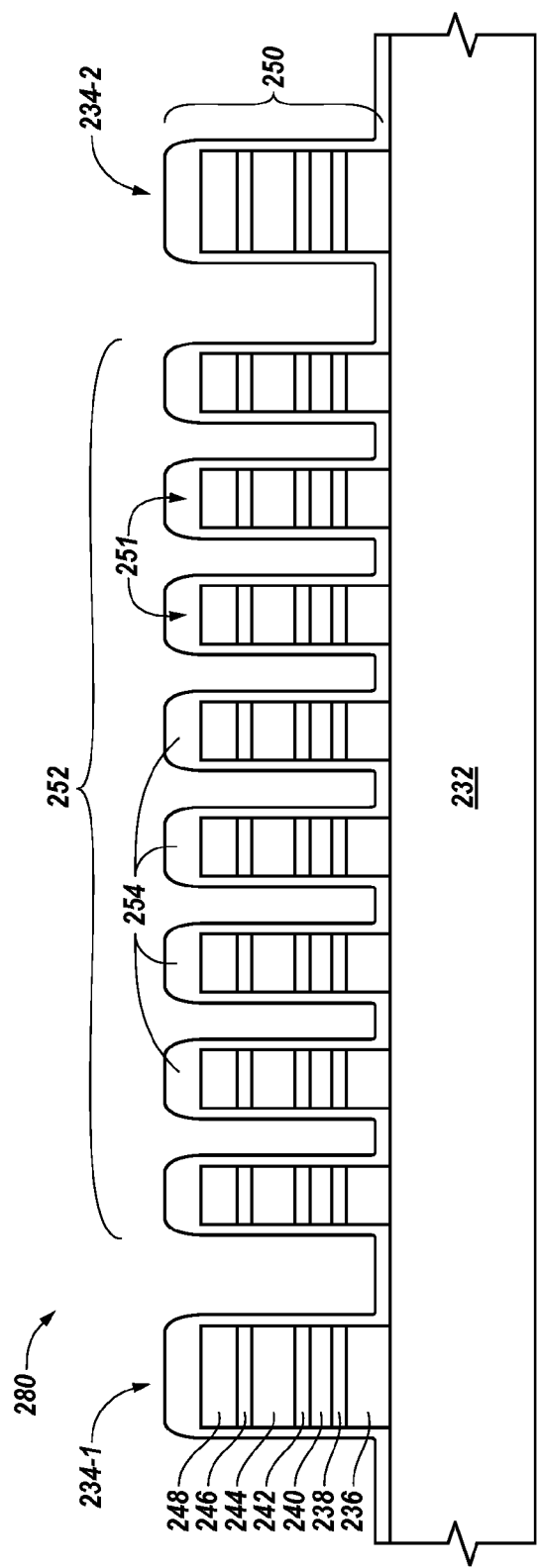
FIGS. 2C-2H illustrate cross-sectional views of a portion of an array of memory cells in accordance with a number of embodiments of the present disclosure.

FIG. 2C illustrates a cross-sectional view of a portion 250 of an array 280 of memory cells shown in a stage subsequent to that shown in FIGS. 2A and 2B. In a number of embodiments, a sealing material 254 is formed over the portion 250, e.g., over hardmask material 248. Sealing material 254 is formed over the dummy material portions 234-1 and 234-2 and the active array portion 252, for example. Sealing material 254 can comprise a material to chemically seal the edges of portions 251, 234-1, and 234-2, such as, for instance, a nitride material.

Figure 2D:
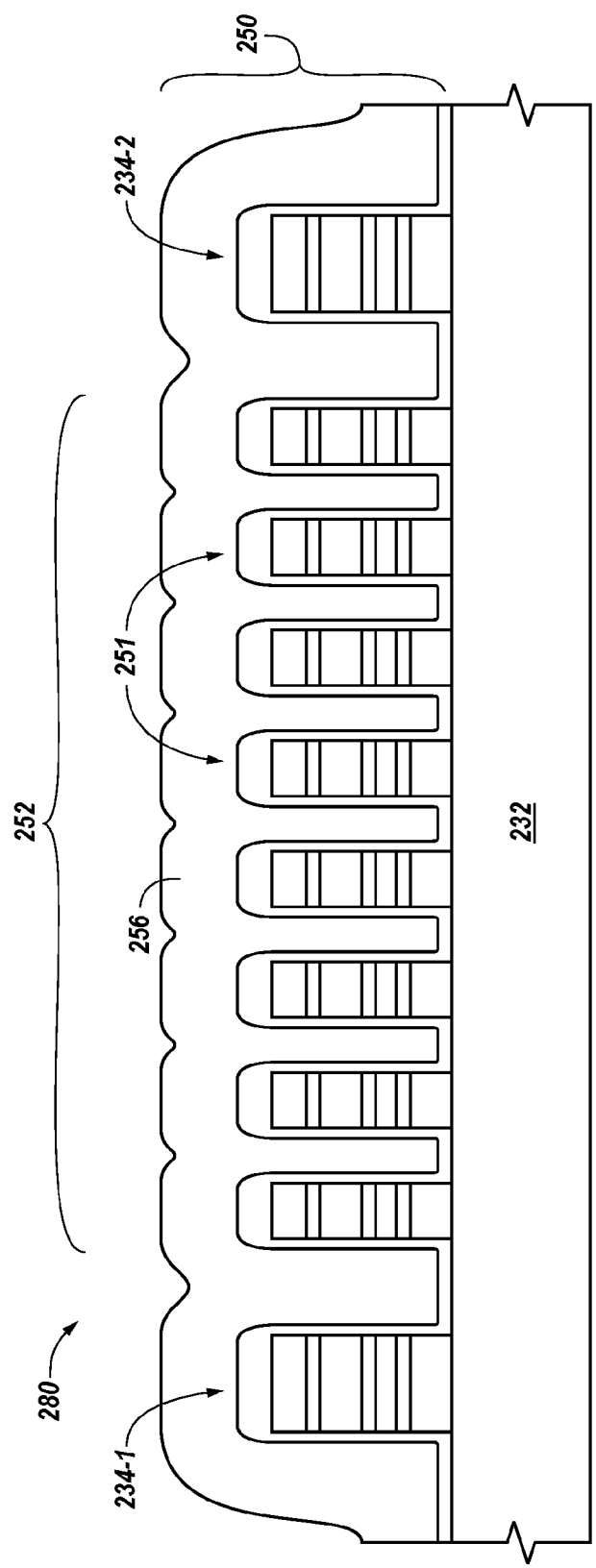

FIG. 2D illustrates a cross-sectional view of a portion 250 of an array 280 of memory cells shown in a stage subsequent to that shown in FIG. 2C. In a number of embodiments, spaces, e.g., vias, openings, gaps, between isolated stack structures, e.g., inactive dummy material portions and isolated active material portions, can be filled with a dielectric material 256. For example, dielectric material 256 can be formed between the dummy material portions 234-1 and 234-2, e.g., inactive dummy stacks, and the active material portions 251 within active array portion 252, e.g., isolated active stacks. Dielectric material 256 can comprise a dielectric oxide or nitride, such as silicon nitride ($Si_3N_4$) or silicon oxide ($SiO_x$), for example. In a number of embodiments, dielectric material 256 can insulate the electrically inactive dummy stack structure from at least one of a first conductive material and a second conductive material (e.g., a word line and a bit line).

Figure 2E:
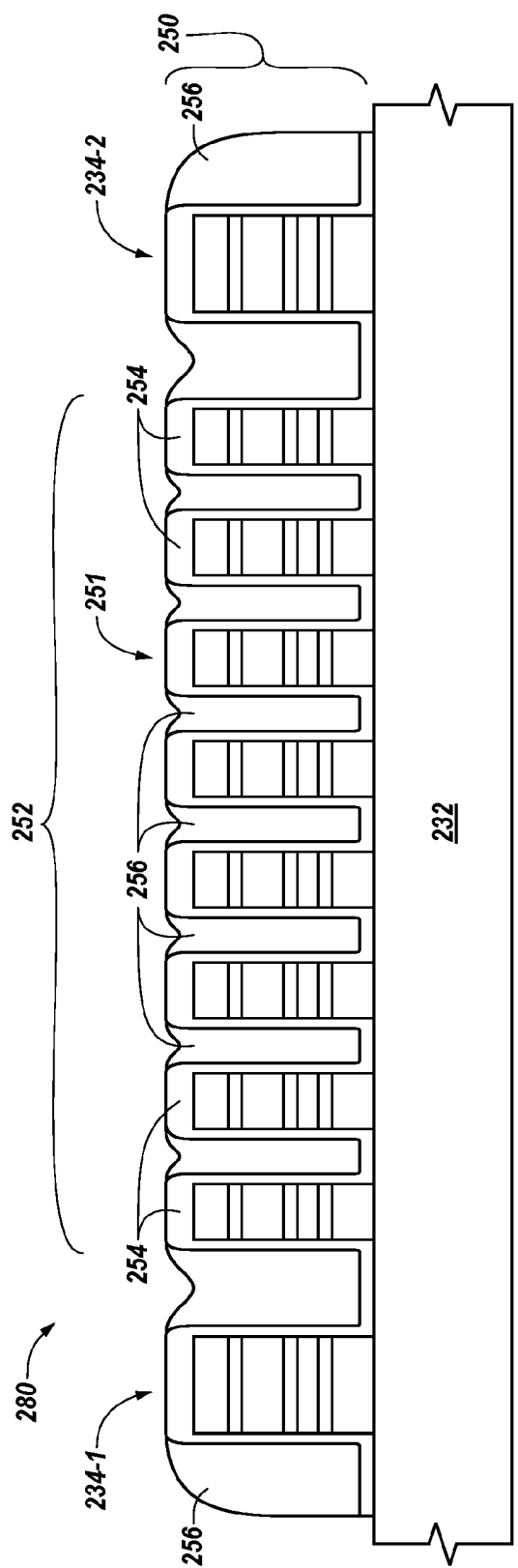

FIG. 2E illustrates a cross-sectional view of a portion 250 of an array 280 of memory cells shown in a stage subsequent to that shown in FIG. 2D. In a number of embodiments, dielectric material 256 is removed, e.g., via dry etch, until a portion, e.g., a top portion, of the material portions are exposed. Dielectric material 256 can be etched away from the dummy material portions 234-1 and 234-2, e.g., inactive dummy stacks, and the active material portions 251, e.g., isolated active stacks until a portion of the materials is exposed. In a number of embodiments, hardmask material 248 and/or sealing material 254 can be preserved during and/or following the dielectric removal.

Figure 2F:
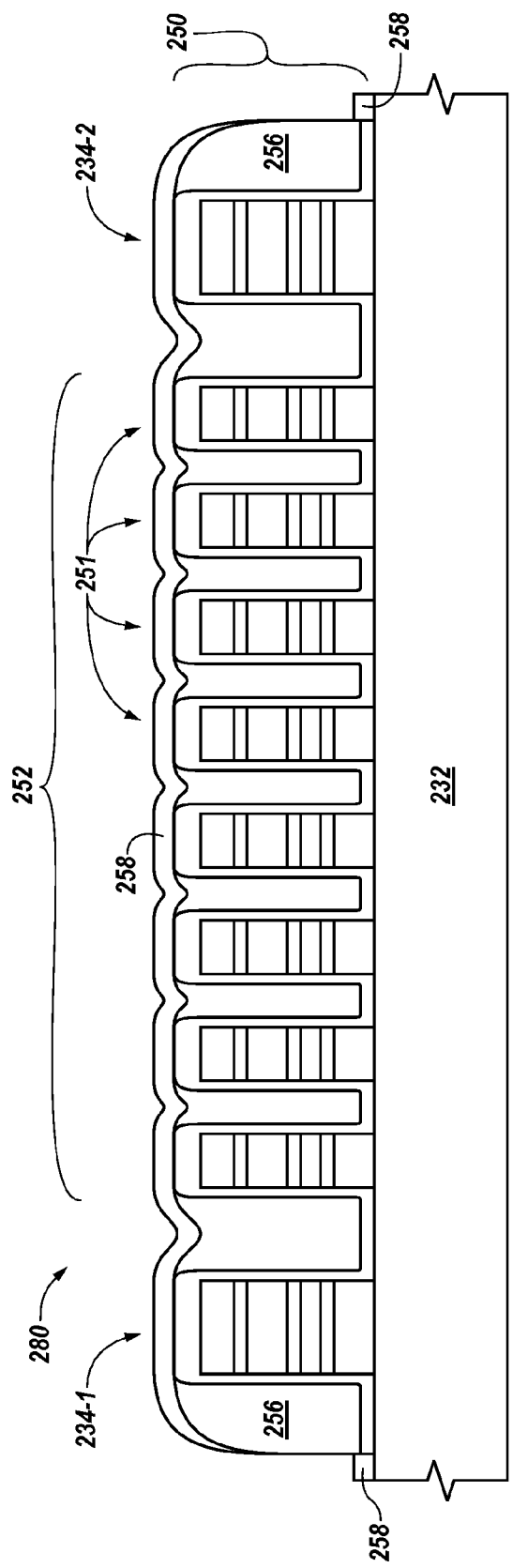

FIG. 2F illustrates a cross-sectional view of a portion 250 of an array 280 of memory cells shown in a stage subsequent to that shown in FIG. 2E. A sacrificial material 258 can be formed over portion 250 in a number of embodiments. Sacrificial material 258, e.g., sacrificial lines or sacrificial material lines, can comprise carbon and/or a dielectric material, among other materials. Sacrificial material 258 can be formed over the dummy material portions 234-1 and 234-2, e.g., inactive dummy stacks, and the active material portions 251, e.g., isolated active stacks. In a number of embodiments, sacrificial material 258 is formed for use in a subsequent planarization, e.g., CMP, process. As a result, portion 250 and inactive dummy material portions 234-1 and 234-2, may be sealed, e.g., completely sealed, and the dielectric material 256 can act as a spacer formed on an external side of the dummy lines material portions 234-1 and 234-2.

Figure 2G:
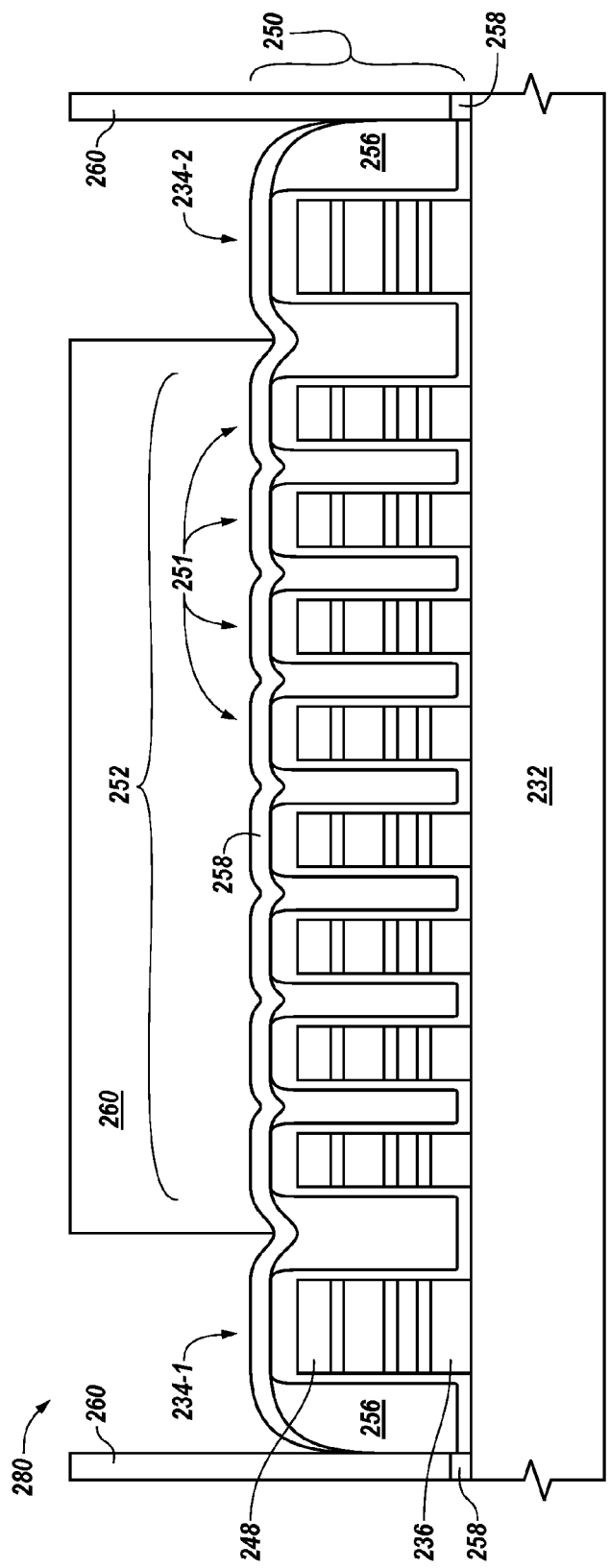

FIG. 2G illustrates a cross-sectional view of a portion 250 of an array 280 of memory cells shown in a stage subsequent to that shown in FIG. 2F. In a number of embodiments, an electrically active memory cell stack structure and a dummy memory cell stack structure can be patterned, e.g., via a mask, to expose the dummy material stack structure. For example, a photoresist material 260 can be formed over array portion 250, e.g., formed over sacrificial material 258. Photoresist material 260 can be formed over the dummy material portions 234-1 and 234-2, e.g., inactive dummy stack structures and the active material portions 251, e.g., isolated active stack structures.

Photoresist material 260 can comprise, for example, a light-sensitive material. In a number of embodiments, photoresist material 260 can be masked and exposed, removing the photoresist material 260 over the region of the dummy material portions 234-1 and 234-2, while leaving the active array portion 252 covered, e.g., completely covered, by photoresist material 260. In a number of embodiments, the exposition can be controlled to avoid an outer active material portion, e.g., an outermost active stack structure, from being exposed and damaged, and the exposition can be controlled to compensate for irregular topography of the exposure that can result from a step between the array 280 and regions external to array 280.

Figure 2H:
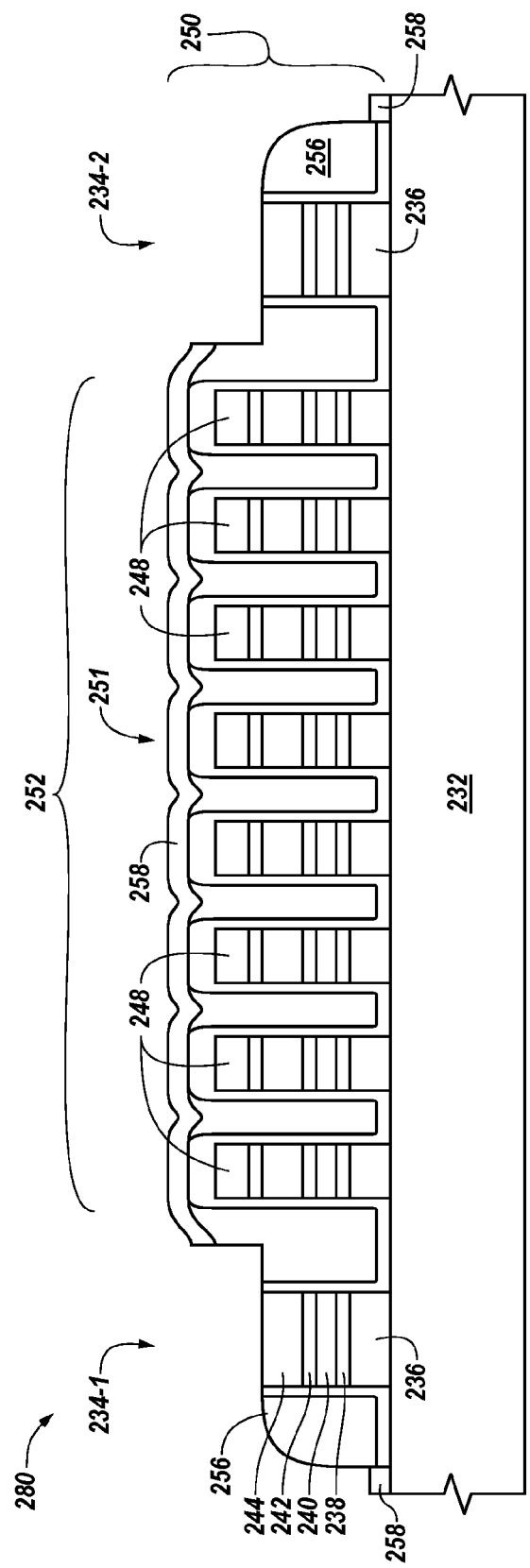

FIG. 2H illustrates a block diagram of a portion 250 of an array 280 of memory cells shown in a stage subsequent to that shown in FIG. 2G. In a number of embodiments, remaining photoresist material 260 can be removed, e.g., etched via dry etch. A portion of dummy material portions 234-1 and 234-2 can be removed, for example, via dry etch. In the example illustrated in FIG. 2H, an electrode material, e.g., electrode material 246 as illustrated in FIG. 2A, hardmask material 248, and sacrificial material 258 are removed from dummy material portions 234-1 and 234-2. However, in a number of embodiments, a different portion of dummy material portions 234-1 and 234-2 are removed. For instance, a portion of electrode material 246, all of memory element 244, all of electrode material 242, all of select element 240, all of electrode material 234, all of conductive line material 236, and/or any portion of the materials can be removed, e.g., etched. The removed material can form a recess such that the dummy material portions 234-1 and 234-2 are separated, e.g., isolated, from a bitline material that may be formed over portion 250. For example, dummy material portions 234-1 and 234-2 are electrically inactive and do not couple to a conductive material formed over portion 250.

Figure 2I:
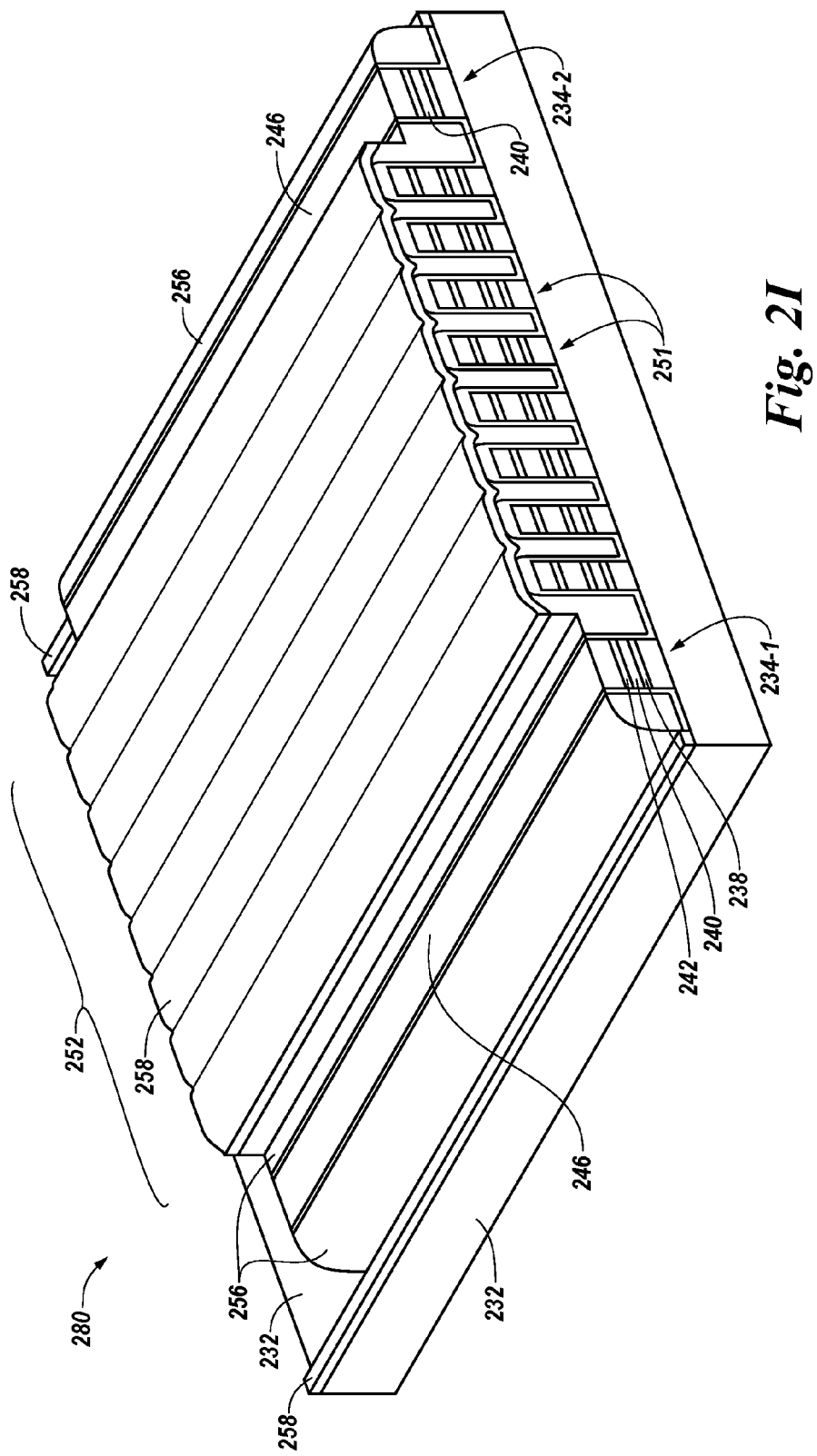
FIG. 2I is a block diagram illustrating a portion of an array of memory cells in accordance with a number of embodiments of the present disclosure.

FIG. 2I illustrates a schematic view of portion 250 in accordance with a number of embodiments of the present disclosure. Similar to FIG. 2H, a portion of dummy material portion 234-1 is removed, e.g., via dry etch. For example, sacrificial material 258, hardmask material 248, electrode material 246, are removed. In a number of embodiments all or a portion of memory element 244 and electrode material 242 can be removed, leaving select element 240 as the topmost material on dummy material portion 234-1. Dummy material portion 234-1 is recessed into dielectric material 256, such that it is electrically inactive, e.g., removed from a bit line material that may be formed over array 250, for instance. In a number of embodiments, dielectric material 256 can insulate the electrically inactive dummy stack structures from at least one of a first conductive material and a second conductive material (e.g., a word line and a bit line). Active array portion 252 and/or other non-dummy portion materials may remain covered by sacrificial material 258.

Figure 2J:
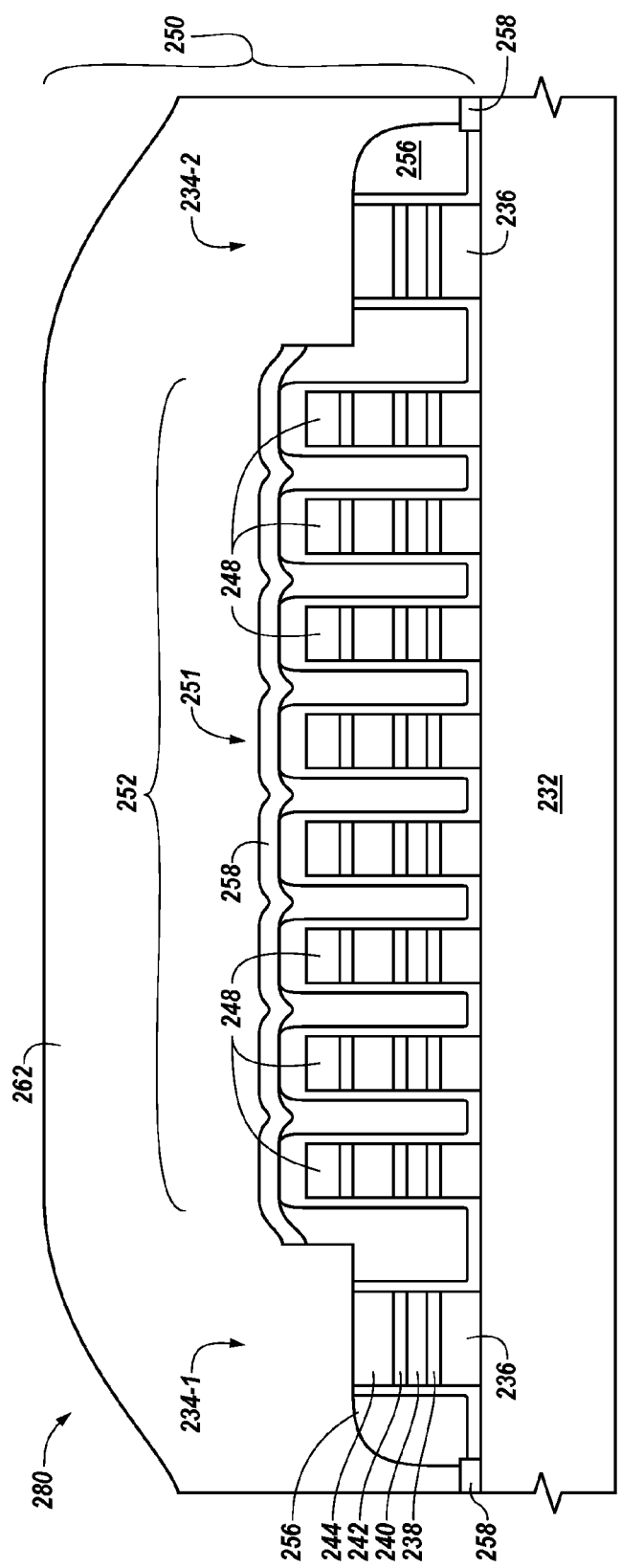
FIGS. 2J-2K illustrate cross-sectional views of a portion of an array of memory cells in accordance with a number of embodiments of the present disclosure.

FIG. 2J illustrates a cross-sectional view of a portion 250 of an array 280 of memory cells shown in a stage subsequent to that shown in FIGS. 2I and 2H. In a number of embodiments, dielectric material 262 is formed over portion 250 and into spaces between isolated stack structures. For example, dielectric material 262 can be formed over and between the dummy material portions 234-1 and 234-2, e.g., inactive dummy stack structures, and the active material portions 251, e.g., isolated active stack structures. Dielectric material 262 can comprise a dielectric oxide or nitride, such as silicon nitride ($Si_3N_4$) or silicon oxide ($SiO_x$), for example.

Figure 2K:
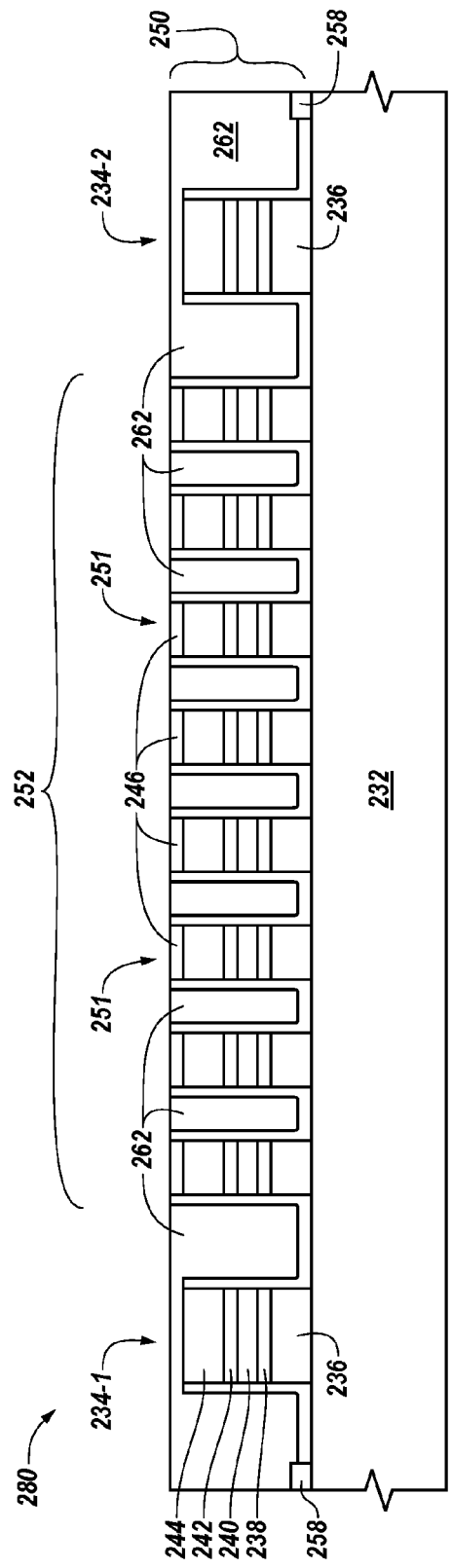

FIG. 2K illustrates a cross-sectional view of a portion 250 of an array 280 of memory cells shown in a stage subsequent to that shown in FIG. 2J. In a number of embodiments, a planarization process, e.g., a CMP process, can be performed in order to level the portion 250. The planarization can remove a portion of dielectric material 262, sacrificial material 258, and hardmask material 248, for example.

As a result, portion 250 may be surrounded, e.g., completely surrounded, by dielectric material 262, and only conductive surfaces of the active material portions 252, e.g., wordline stack structures, active stack structures, are exposed. Dummy material portions 234-1 and 234-2, being recessed, are buried into dielectric material 262.

Conductive materials, e.g., bitline materials, can be subsequently connected to the active material portions 252, e.g., active stack structures, wordline stack structures, through the exposed conductive surfaces, while the dummy material portions 234-1 and 234-2 are physically and electrically separated, e.g., isolated, inactivated, from the conductive, e.g., bitline, materials. As a result, possible morphological defects of the dummy material portions 234-1 and 234-2, e.g., caused by iso-dense loading, may not have an electrical impact on the functionality of portion 250 and/or array 280. The conductive, e.g., bitline, material and a part of underlying cells can be patterned substantially orthogonal to the conductive lines 236, e.g., wordlines, can form bitlines, completing a cross-point array. In a number of embodiments, substantially orthogonal can comprise, for example, a little more than orthogonal or a little less than orthogonal, but within a threshold. For example, a substantially orthogonal direction can comprise a direction that is closer to orthogonal than parallel.

In a number of embodiments, the processes illustrated in FIGS. 2G-2K comprise a chop sequence, e.g., a wordline chop sequence. For example, the chop sequence can include patterning an electrically active memory cell stack structure and a dummy memory cell stack structure to expose the dummy memory cell stack structure. For instance, patterning can include forming a photoresist material and exposing the photoresist material over the dummy portion materials. The chop sequence can also include removing a portion of the dummy memory cell stack structure, removing the photoresist material, forming a dielectric material over the array, e.g., the entire array, and planarizing portions of and/or the entire array to level the array. In a number of embodiments, as a result of the chop sequence, the dummy memory cell stack structures of the word line array are electrically inactive.

FIGS. 3A-3E illustrate cross-sectional views and/or block diagrams of a portion of an array of memory cells in accordance with a number of embodiments of the present disclosure. The portion of the array 380 of memory cells in FIGS. 3A-3E can be a portion of an array such as array 100 illustrated in FIG. 1A and/or array 101 illustrated in FIG. 1B. The portion of the array 380 of memory cells can be in a direction substantially perpendicular to the array of memory cells illustrated in FIGS. 3A-3E, for example.

FIG. 3A illustrates a cross-sectional view of a portion of an array 380 in accordance with a number of embodiments of the present disclosure. In the example illustrated in FIG. 3A, a portion 365, e.g., a bitline portion, of array 380 has been formed over a portion 351, e.g., a wordline portion, of array 380, and the portion 365 has been etched. For instance, portion 365, can be created through dry etch patterning and can be formed. In a number of embodiments, In a number of embodiments, portion 365 of array 380 is formed on a substrate 332. Portion 365 and substrate 332 may be similar or the same as example portion 250 and example substrate 232 illustrated in FIGS. 2A-2K, for instance. Portion 365 of array 380 can include a number of active material portions 361, e.g., active stack structures, within an active array portion 382 and a number of dummy material portions 376-1 and 376-2, e.g., dummy stack structures.

In a number of embodiments, each of the active material portions 361 and dummy material portions 376-1 and 376-2 can comprise a metal conductive line material 366, e.g., bitline material, formed over portion 351, metal material 368, e.g., carbon, formed of conductive line material 366, and hardmask material 370 formed over metal material 366, for example. Conductive line material 366 can comprise, for example, a tungsten material, among other conductive materials. In a number of embodiments, dummy material portions 376-1 and 376-2 can be located on different edges, e.g., outer edges, of active array portion 382, for example.

In a number of embodiments, metal material 368 is not formed over electrode material; rather hardmask material 370 can be formed, e.g., directly, over electrode material 366. Electrode material 366, metal material 368, and hardmask material 370 can form a portion 365 of array 380, for example, a bitline portion of array 380, and portion 351 can form a portion 351 of array 380, for example a wordline portion of array 380. In a number of embodiments, hardmask material 370 is formed over portion 365, but a hardmask material is not formed over portion. Alternatively, a hardmask material (e.g., hardmask material 248 formed over portion 250 as illustrated n FIGS. 2A-2K) may be formed, but hardmask material 370 may not be formed. In a number of embodiments, both a hardmask material over portion 351 (e.g., similarly to hardmask material 248 formed over portion 250) and hardmask material 370 can be formed.

Though not illustrated in FIG. 3A, a sealing material can be formed over portion 365 of array 380, including active material portions 361 of active array portion 382 and dummy material portions 376-1 and 376-2. The sealing material can comprise a material to chemically seal the edges of portions 382, 376-1, and 376-2, for instance. A dielectric material can be formed over portion 365 to fill spaces between and/or cover the isolated stack structures, e.g., active material portions 361 and dummy material portions 376-1 and 376-2.

The dielectric material, e.g., or a portion of the dielectric material, can be removed, e.g., via dry etch, until a portion of active material portions 382 and dummy material portions 376-1 and 376-2 are exposed. A sacrificial material can be formed over portion 365, e.g., including active material portions 382 and dummy material portions 376-1 and 376-2. In a number of embodiments, this sacrificial material can be utilized in a subsequent planarization process, e.g., a subsequent CMP process. As a result, dummy material portions 376-1 and 376-2 can be separated, e.g., isolated, from active material portions 361 using the dielectric material as a spacer.

Figure 3B:
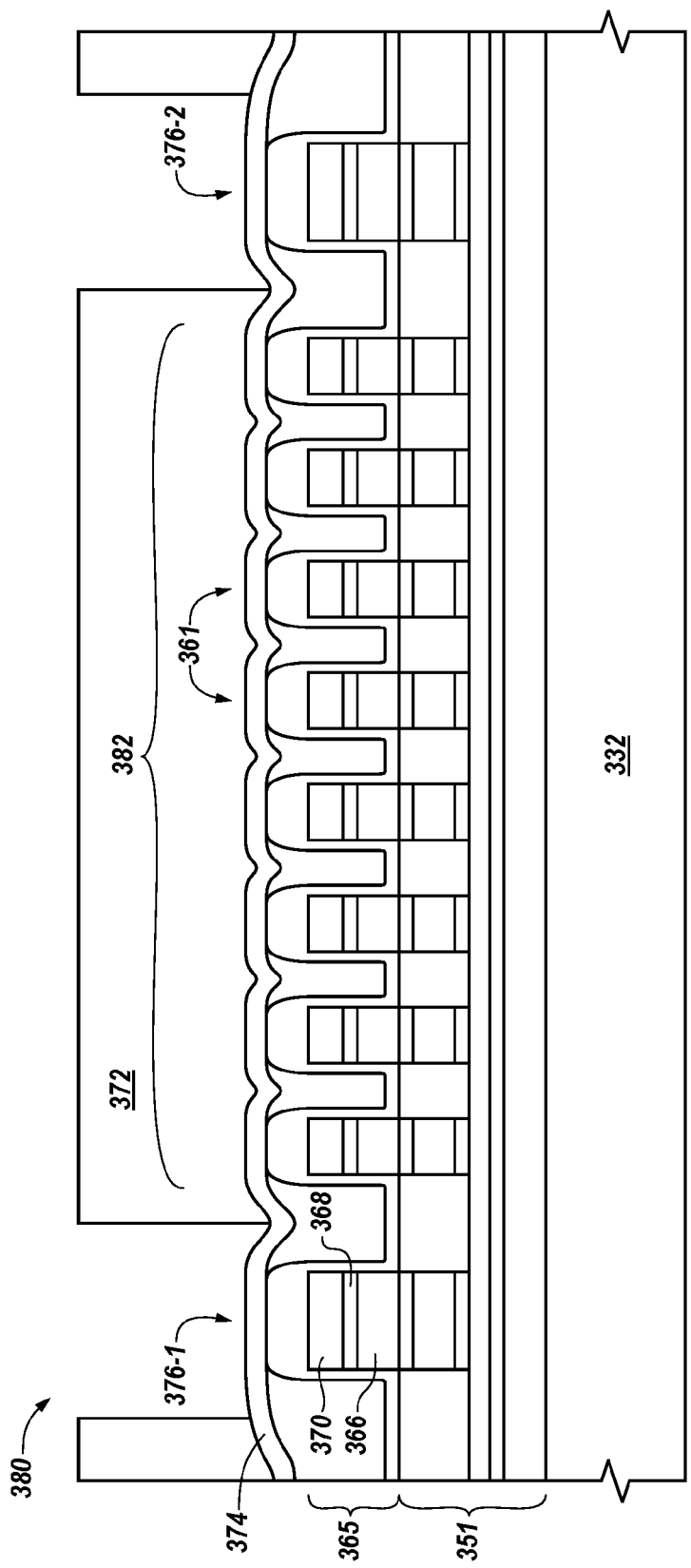

FIG. 3B illustrates a cross-sectional view of a portion of an array 380 of memory cells shown in a stage subsequent to that shown in FIG. 3A. In a number of embodiments, an electrically active memory cell stack structure and a dummy memory cell stack structure can be patterned, e.g., via a mask, to expose the dummy material stack structure. In a number of embodiments, a photoresist material 372 is formed over portion 365, e.g., formed over hardmask material 370. Photoresist material 372 can be formed over the dummy material portions 376-1 and 376-2, e.g., inactive dummy stack structures, and the active material portions 361, e.g., isolated active stack structures. Photoresist material 372 can comprise, for example, a light-sensitive material. In a number of embodiments, photoresist material 372 can be masked and exposed removing the photoresist material 372 over the region of the dummy material portions 376-1 and 376-2 and leaving the active material portions 361 covered, e.g., completely covered, by photoresist material 372. In a number of embodiments, the exposition can be controlled to avoid an outer active material portion, e.g., and outermost active stack structure, from being exposed and damaged, and the exposition can be controlled to compensate for irregular topography of the exposure that can result from a step between the array and external regions. In a number of embodiments, the patterning can include patterning of both portions 365 and 351, e.g., portion 351 is not patterned before portion 365 is formed over it; rather one patterning is performed for both.

Figure 3C:
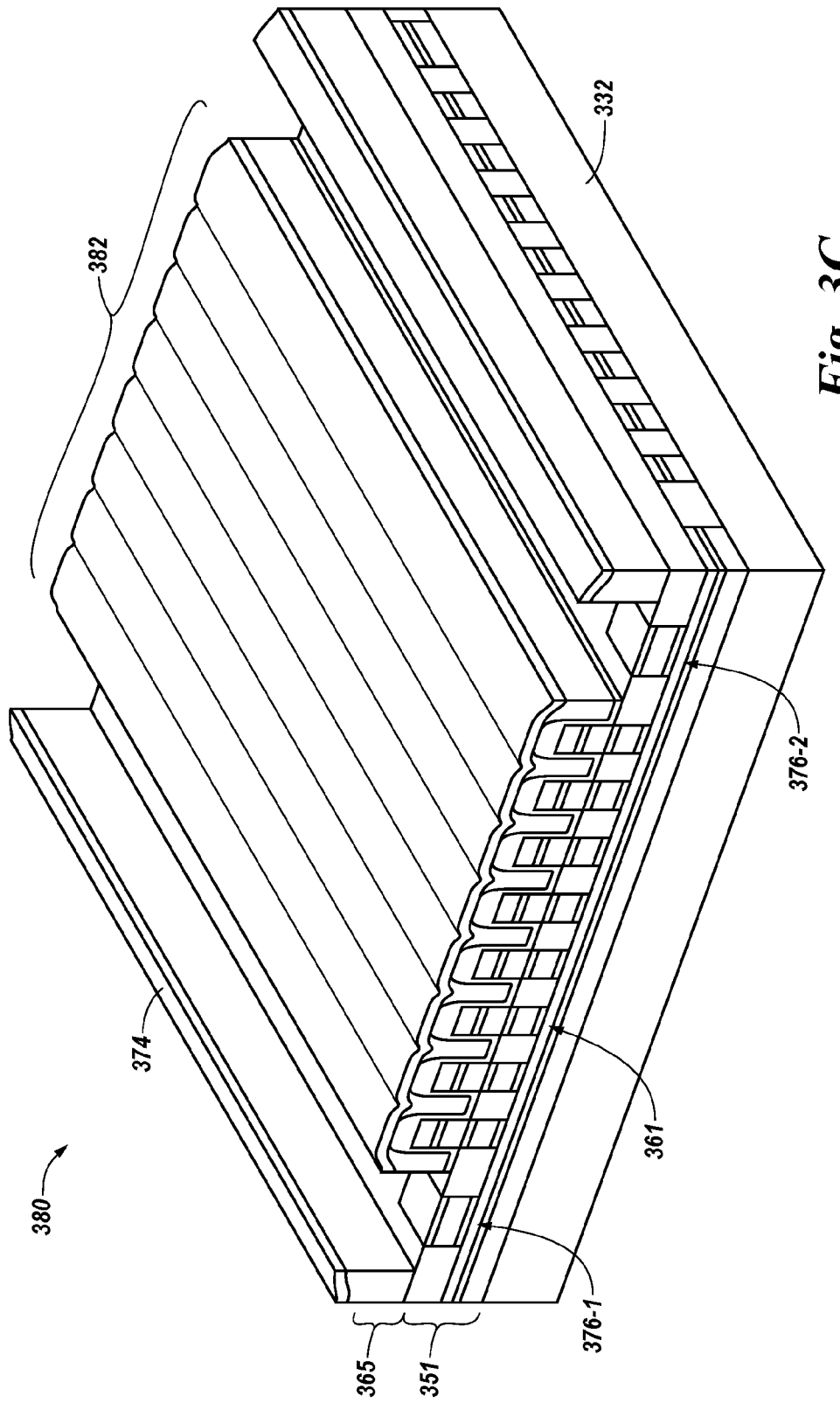
FIG. 3C is a block diagram illustrating a portion of an array of memory cells in accordance with a number of embodiments of the present disclosure.

FIG. 3C illustrates block diagram of a portion of an array 380 of memory cells shown in a stage subsequent to that shown in FIG. 3B. A portion of dummy material portions 376-1 and 376-2 can be removed, for example, via dry etch. In the example illustrated in FIG. 3C, the hardmask material, the metal material, and the electrode material are removed from dummy material portions 376-1 and 376-2. However, in a number of embodiments, a different portion of dummy material portions 376-1 and 376-2 can be removed. For instance, the hardmask material and a portion of metal material may be removed, e.g., etched; only a portion of the metal material may be removed; and/or the hardmask material 370, the metal material, and all or a portion of conductive line material 366 can be removed. In a number of embodiments, the removed material can form a recess such that the dummy material portions 376-1 and 376-2 are electrically separated, e.g., isolated, inactivated, from a wordline material adjacent, e.g., above and/or below, dummy material portions 376-1 and 376-2.

Figure 3D:
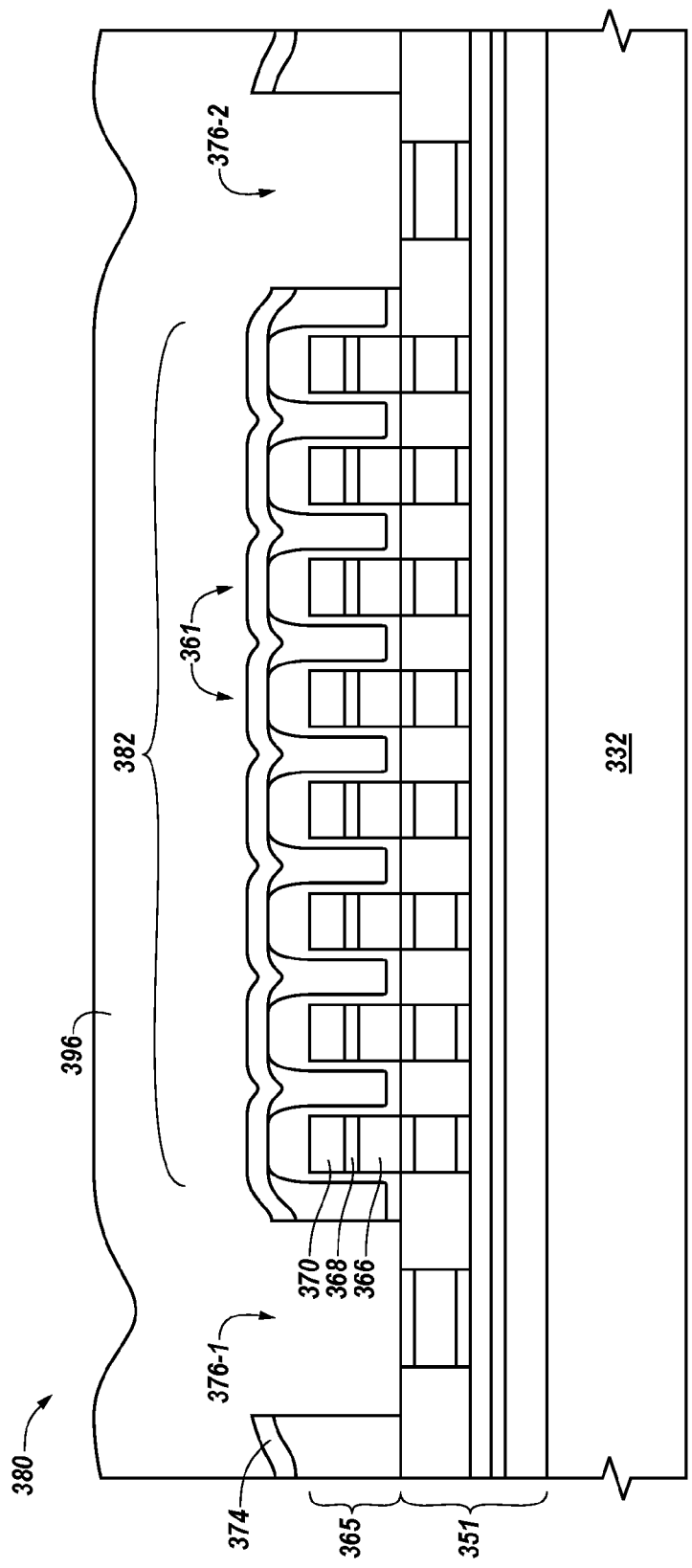
FIGS. 3D-3E illustrate cross-sectional views of a portion of an array of memory cells in accordance with a number of embodiments of the present disclosure.

FIG. 3D illustrates a cross-sectional view of a portion of an array 380 of memory cells shown in a stage subsequent to that shown in FIG. 3C. In a number of embodiments, dielectric material 396 is formed over portion 365 of array 380. Dielectric material 396 can be formed over and between the dummy material portions 376-1 and 376-2, e.g., inactive dummy stack structures, and the active material portion 382, e.g., isolated active stack structures. Dielectric material 396 can comprise a dielectric oxide or nitride, such as silicon nitride ($Si_3N_4$) or silicon oxide ($SiO_x$), for example.

Figure 3E:
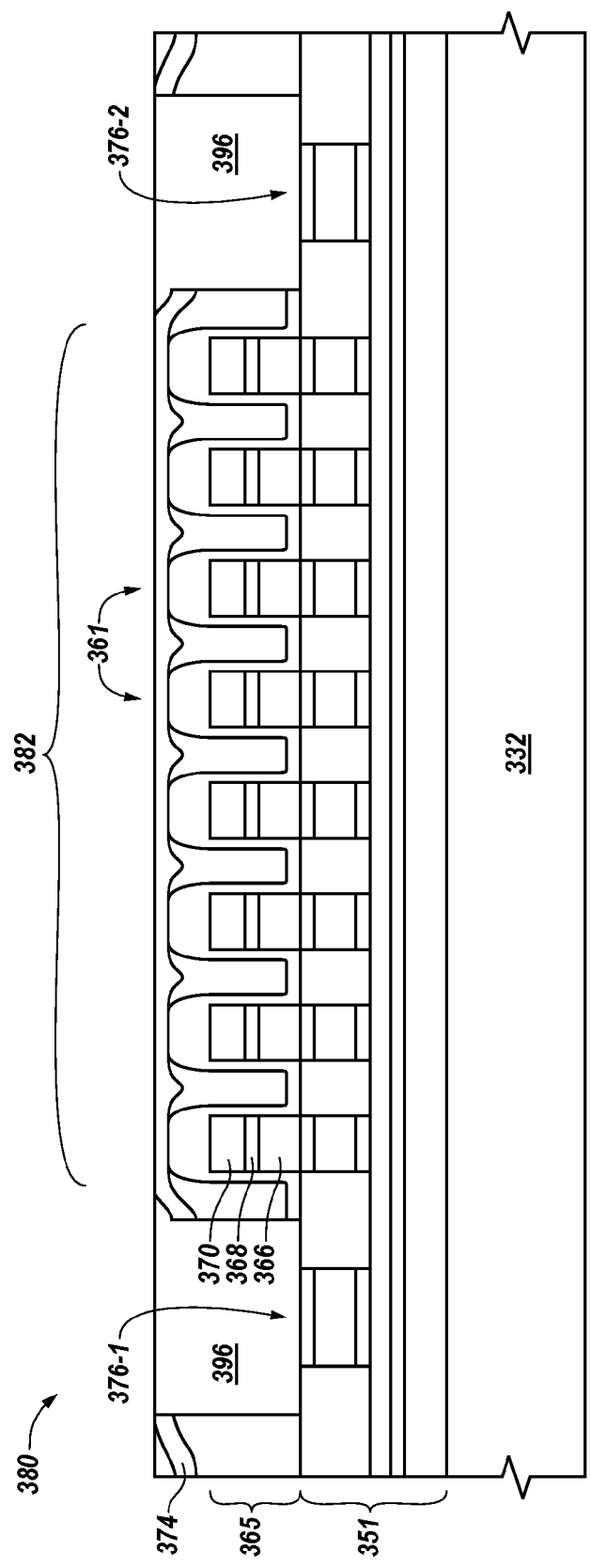

FIG. 3E illustrates a cross-sectional view of a portion of an array 380 of memory cells shown in a stage subsequent to that shown in FIG. 3D. In a number of embodiments, a planarization process, e.g., CMP, can be performed, removing a portion of dielectric material 396 and forming a planar surface on the dielectric material 396. For example, a planarization process can be performed in order to level the array 380. The planarization can planarize a step between array 380 and regions external to the array 380. As a result, the array 380 may be surrounded, e.g., completely surrounded, by dielectric material 396, and only conductive surfaces of the active stack structures 382, e.g., bitline stack structures, active stack structures, are exposed (not illustrated in FIG. 3E). Dummy material portions 376-1 and 376-2, being recessed, are buried into dielectric material 396.

Conductive materials, e.g., wordline metal materials, can be subsequently connected to the active stack structures 361, e.g., bit stack structures, through the exposed conductive surfaces (not illustrated in FIG. 3E), while the dummy material portions 376-1-1 and 376-2 are physically and electrically separated, e.g., isolated, from them. As a result, possible morphological defects of the dummy material portions 376-1 and 376-2, caused by iso-dense loading may not have an electrical impact on the functionality of array 280.

In a number of embodiments, the process illustrated in FIGS. 3B-3E comprises a chop sequence, e.g., a bit line chop sequence. For example, the chop sequence can include patterning an electrically active memory cell stack structure and a dummy memory cell stack structure to expose the dummy memory cell stack structure. For instance, patterning can include forming a photoresist material and exposing the photoresist material over the dummy portion materials. The chop sequence can also include removing a portion of the dummy portion materials, removing the photoresist material, forming a dielectric material over the array, and planarizing the array to level the array. In a number of embodiments, as a result of the chop sequence, the dummy material portions 376-1 and 376-2 of the array are electrically inactive.

In a number of embodiments, the processes of forming a memory cell and/or memory cell array can be repeated a number of times to create a number of decks, e.g., tiers. For example, the process of forming the portion 250 in as illustrated FIGS. 2A-2K and portion 365 as illustrated in FIGS. 3A-3E can be repeated a number of times to form a number of memory cell and/or memory cell array decks, e.g., three-dimensional cross-point memory arrays.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. An array of memory cells, comprising:
a first stack structure coupled to a conductive material via an exposed conductive surface of the first stack structure,
wherein the exposed conductive surface is the only exposed portion of the first stack structure; and
an electrically inactive stack structure located at an edge of the first stack structure, wherein the electrically inactive stack structure is physically isolated from the conductive material to which the first stack structure is coupled and is connected to only the first conductive material.

2. The array of claim 1, wherein the first stack structure further comprises:
a select element between a first electrode and a second electrode; and
a memory element between the second electrode and a third electrode.

3. The array of claim 1, further comprising a second stack structure formed on the first stack structure, each of the first and the second stack structure comprising the conductive material.

4. The array of claim 1, further comprising a dielectric material between the first stack structure and the electrically inactive stack structure.

5. The array of claim 1, wherein the first stack structure comprises a different dimension than the electrically inactive stack structure.

6. The array of claim 1, wherein the array is a cross-point array.

7. An array of memory cells, comprising:
a first electrically active stack structure coupled to a conductive material via an exposed conductive surface of the first electrically active stack structure,
wherein the exposed conductive surface is the only exposed portion of the first stack structure;
a second electrically active stack structure coupled to the first electrically active stack structure and coupled to the conductive material;
a first electrically inactive stack structure; and
a second electrically inactive stack structure,
wherein the first and the second electrically inactive stack structures are physically isolated from the conductive material to which the first and the second electrically active stack structures are coupled and are connected to only the first conductive material.

8. The array of claim 7, further comprising:
the first electrically inactive stack structure located at an outer edge of the first electrically active stack structure; and
the second electrically inactive stack structure located at an outer edge of the second electrically active stack structure.

9. The array of claim 7, further comprising the second electrically active stack structure coupled to the first electrically active stack structure via the exposed conductive surface of the first electrically active stack.

10. The array of claim 7, further comprising at least one of the first electrically inactive stack structure and the second electrically inactive stack structure being wider than each of the first electrically active stack structure and the second electrically active stack structure.

11. The array of claim 7, further comprising:
each of the first and the second electrically inactive stack structures located at a different outer edge of the first electrically active stack structure; and
each of a third and a fourth electrically inactive stack structure located at a different outer edge of the second stack structure and physically isolated from a second conductive material.

12. The array of claim 7, wherein the array is a three-dimensional cross-point array of memory cells.

13. A method of forming an array of memory cells, comprising:
forming a material over a first dummy material stack structure to electrically inactivate the first dummy material stack structure and physically isolate the first dummy material stack structure from a conductive material to which a first electrically active stack structure is coupled via an exposed conductive surface of the first electrically active stack structure,
wherein the exposed conductive surface is the only exposed portion of the first stack structure, and
wherein the first dummy material stack structure is connected to only the conductive material.

14. The method of claim 13, further comprising forming a second electrically active stack structure over the first electrically active stack structure.

15. The method of claim 13, further comprising:
performing a first chop sequence on the first electrically active stack structure and the first dummy material stack structure; and
forming a second electrically active stack structure over the first electrically active stack structure.

16. The method of claim 15, further comprising:
forming a second dummy stack structure located at an edge of the second electrically active stack structure; and
performing a second chop sequence on the second electrically active stack structure and the second dummy stack structure to electrically inactivate the second dummy memory cell stack structure.

17. The method of claim 16, wherein the second chop sequence comprises:
patterning the second electrically active stack structure and the second dummy stack structure to expose the second dummy stack structure;
removing a portion of the second dummy stack structure via an etch;
forming a dielectric material over the second electrically active stack structure, the second dummy stack structure, and into spaces formed during the dummy stack structure etch; and
planarizing the dielectric material to expose a conductive portion of the second electrically active stack structure.

18. The method of claim 13, further comprising:
patterning the first electrically active stack structure and the first dummy material stack structure to expose the first dummy material stack structure;
removing a portion of the first dummy material stack structure; and
forming the material over the first dummy material stack structure.

19. The method of claim 18, wherein removing a portion of the dummy material stack structure includes etching a portion of the dummy material stack structure via a dry etch.

20. The method of claim 18, wherein patterning the first electrically active stack structure and the first dummy material stack structure to expose the first dummy material stack structure comprises:
  forming a photoresist material over the first electrically active stack structure; and
  exposing the photoresist material over the first dummy material stack structure.

* * * * *